United States Patent
Shin et al.

(10) Patent No.: US 11,457,536 B2
(45) Date of Patent: Sep. 27, 2022

(54) PROTECTIVE FILM, ELECTRONIC DEVICE HAVING SAME, AND METHOD FOR ATTACHING PROTECTION FILM

(71) Applicant: Samsung Display Co., Ltd., Yongin-si (KR)

(72) Inventors: Heonjung Shin, Hwaseong-si (KR); Kyungtae Kim, Anyang-si (KR); Boa Kim, Icheon-si (KR); Hyunjoon Oh, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 494 days.

(21) Appl. No.: 16/567,847

(22) Filed: Sep. 11, 2019

(65) Prior Publication Data
US 2020/0163243 A1 May 21, 2020

(30) Foreign Application Priority Data

Nov. 20, 2018 (KR) .................. 10-2018-0143760

(51) Int. Cl.
*H05K 5/03* (2006.01)
*H05K 5/00* (2006.01)
(Continued)

(52) U.S. Cl.
CPC ............... *H05K 5/03* (2013.01); *B29C 63/02* (2013.01); *B32B 37/12* (2013.01); *G01N 3/20* (2013.01);
(Continued)

(58) Field of Classification Search
CPC ........ H05K 5/03; H05K 5/0017; B29C 63/02; B29C 63/0017; B32B 37/12; B32B 2457/00; G01N 3/20; G06F 1/1652; H04M 1/0268; H04M 1/185; C09J 7/22; C09J 7/40; Y10T 428/14; B29K 2995/0046; B29K 2995/0082; B29L 2031/3475; G09F 9/301; G02F 1/1335; G02F 1/13338

See application file for complete search history.

(56) References Cited

U.S. PATENT DOCUMENTS 10,005,264 B2 6/2018 Leatherdale et al.
2002/0155283 A1 10/2002 Carter et al.
(Continued)

FOREIGN PATENT DOCUMENTS

KR 10-2016-0038843 A 4/2016
KR 10-1825983 B1 2/2018
(Continued)

OTHER PUBLICATIONS

Partial European Search Report for corresponding European Application No. 19210377.8, dated Feb. 26, 2020, 15 pages.

*Primary Examiner* — Patricia L. Nordmeyer
(74) *Attorney, Agent, or Firm* — Lewis Roca Rothgerber Christie LLP

(57) ABSTRACT

An electronic device includes a flexible display module, a window on the flexible display module, and a protective base film on the window, and having a first modulus at a first temperature and a second modulus lower than the first modulus at a second temperature 80° C. higher than the first temperature, wherein the difference between the first modulus and the second modulus may be no greater than about 985 MPa.

10 Claims, 18 Drawing Sheets

(51) Int. Cl.
    *H04M 1/02*         (2006.01)
    *G06F 1/16*          (2006.01)
    *C09J 7/22*          (2018.01)
    *H04M 1/18*         (2006.01)
    *B32B 37/12*        (2006.01)
    *G01N 3/20*         (2006.01)
    *B29C 63/02*        (2006.01)
    *C09J 7/40*          (2018.01)

(52) U.S. Cl.
    CPC ........ *G06F 1/1652* (2013.01); *H04M 1/0268* (2013.01); *H04M 1/185* (2013.01); *H05K 5/0017* (2013.01); *B32B 2457/00* (2013.01); *C09J 7/22* (2018.01); *C09J 7/40* (2018.01); *Y10T 428/14* (2015.01)

(56) References Cited

U.S. PATENT DOCUMENTS

2017/0121564 A1*   5/2017   Cho .................... C08F 265/06
2017/0210104 A1     7/2017   Doo et al.
2017/0365804 A1   12/2017   Johnson et al.
2019/0047900 A1     2/2019   Hu et al.
2019/0136101 A1     5/2019   Okamoto et al.

FOREIGN PATENT DOCUMENTS

KR     10-2018-0085045 A     7/2018
WO     WO 2016/196576 A1   12/2016
WO     WO 2017/160680 A1    9/2017
WO     WO 2017/183335 A1   10/2017

* cited by examiner

PROTECTIVE FILM, ELECTRONIC DEVICE HAVING SAME, AND METHOD FOR ATTACHING PROTECTION FILM

CROSS-REFERENCE TO RELATED APPLICATION

This application claims priority to and the benefit of Korean Patent Application No. 10-2018-0143760, filed on Nov. 20, 2018, the entire contents of which are hereby incorporated by reference.

BACKGROUND

Electronic devices provide information to users by displaying various images on display screens. In general, electronic devices display information within an assigned screen. Recently, flexible electronic devices each including a foldable flexible display panel have been developed. The flexible electronic devices may be folded, rolled, or bent unlike rigid electronic devices. Because the flexible electronic devices having variously changeable shapes may be carried regardless of the screen size, a user's convenience may be improved.

When a structure for ensuring flexibility of an electronic device is applied to a flexible electronic device, the shock resistance of the flexible electronic device may be degraded. In addition, when a structure for reinforcing durability against shock is applied to a flexible electronic device, the flexibility of the flexible electronic device may be degraded.

SUMMARY

Embodiments of the present disclosure provide a protective film having improved bending reliability under a low-temperature environment and a high-temperature environment, and a method for attaching the protective film. Embodiments of the present disclosure also provide an electronic device including a protective film having improved bending reliability under a low-temperature environment and a high-temperature environment.

An embodiment of the present disclosure provides an electronic device including a flexible display module, a window on the flexible display module, and a protective base film on the window, and having a first modulus at a first temperature and a second modulus lower than the first modulus at a second temperature about 80 degrees Celsius (° C.) higher than the first temperature, wherein a difference between the first modulus and the second modulus is about 985 MPa or less.

In an embodiment, the first temperature may be about minus 20° C., and the second temperature may be about 60° C.

In an embodiment, the first modulus may be about 1,000 MPa or less.

In an embodiment, the second modulus may be 15 MPa or more.

In an embodiment, the electronic device may further include a functional layer on the protective base film.

In an embodiment, a thickness of the functional layer may be no greater than about one tenth of a thickness of the protective base film.

In an embodiment, a thickness of the protective base film may be about 30 μm or more to about 300 μm or less.

In an embodiment, the electronic device may further include an adhesive layer between the window and the protective base film.

In an embodiment, the flexible display module may be a foldable display module.

In an embodiment, the flexible display module may include: a display panel; a sensing unit on the display panel; and a reflection prevention layer on the sensing unit.

In an embodiment of the present disclosure, a protective film includes: a protective base film having a first modulus of about 1,000 MPa or less at a first temperature and a second modulus of 15 MPa or more at a second temperature about 80° C. higher than the first temperature; a functional layer on the protective base film; an adhesive layer under the protective base film; and a release layer under the adhesive layer.

In an embodiment, the first temperature may be about minus 20° C., the second temperature may be about 60° C., and the first modulus may be higher than the second modulus.

In an embodiment, a thickness of the protective base film may be about 30 μm or more to about 300 μm or less, and a thickness of the functional layer may be no greater than about one tenth of the thickness of the protective base film.

In an embodiment of the present disclosure, a method for attaching a protective film includes: preparing a test protective film; measuring a first modulus of the test protective film at a first temperature; measuring a second modulus of the test protective film at a second temperature higher than the first temperature; checking a first modulus and a second modulus of a protective film; and attaching a protective film having a same (e.g., substantially the same) physical property as the test protective film to a target object.

In an embodiment, the checking of the first modulus and the second modulus may include: checking whether the first modulus is about 1,000 MPa or less; and checking whether the second modulus is about 15 MPa or more.

In an embodiment, the target object may be a release layer.

In an embodiment, the target object may be a window of an electronic device.

In an embodiment, the first modulus and the second modulus may be measured by a dynamic mechanical analysis method.

In an embodiment, each of the test protective film and the protective film may include a protective base film.

In an embodiment, each of the test protective film and the protective film may include: a protective base film; and a functional layer formed on the protective base film.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
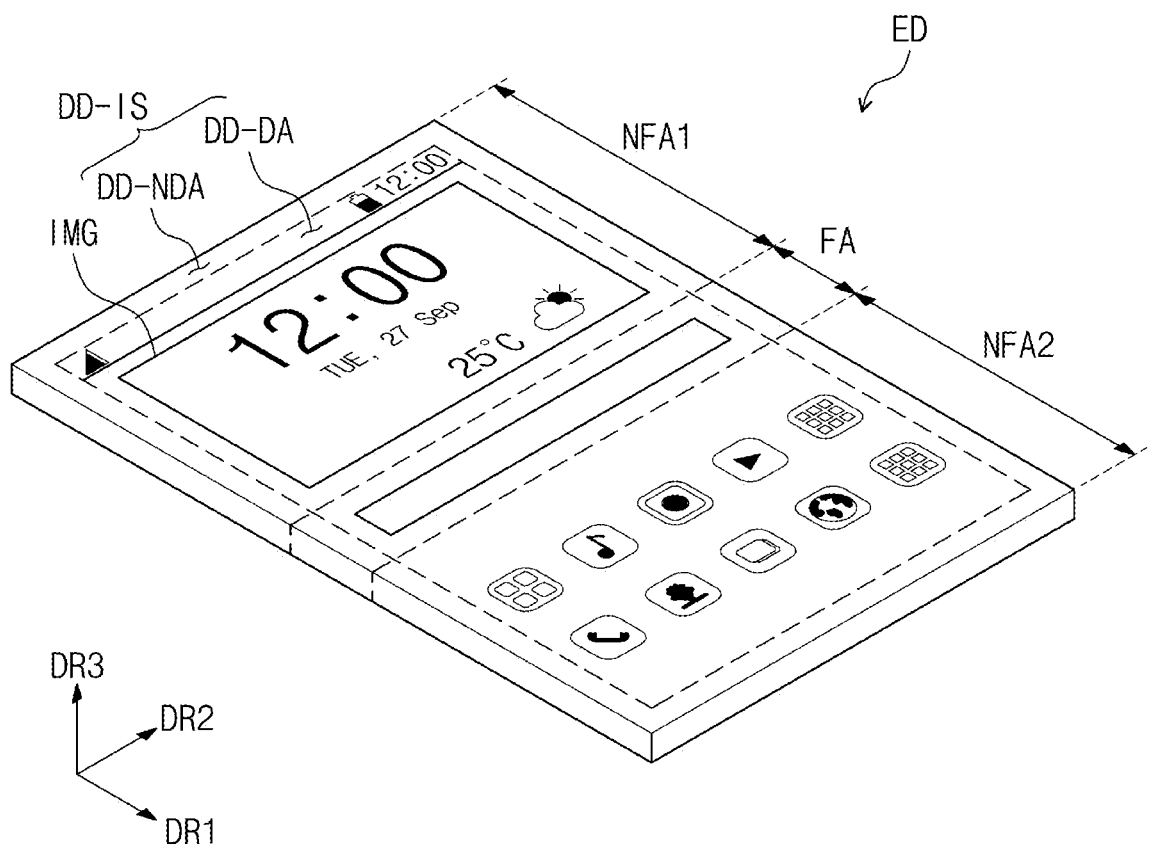
FIG. 1 is a perspective view of an electronic device according to an embodiment of the present disclosure.

In the present disclosure, it will be understood that when an element (or region, layer, portion, etc.) is referred to as being "on", "connected to" or "coupled to" another element, it may be directly on, connected or coupled to the other element or another element may be interposed therebetween.

Like reference numbers refer to like elements. Also, in the figures, the dimensions of layers and regions may be exaggerated for clarity of illustration.

The term "and/or" includes any of one or more combinations that may be defined by the associated listed items.

It will be understood that although the terms first and second are used herein to describe various elements, these elements should not be limited by these terms. The above terms are only used to distinguish one component from another component. For example, a first element may be referred to as a second element and the second element may also be referred to as the first element without departing from the spirit and scope of the present disclosure. The terms of a singular form may include plural forms unless the context clearly indicates otherwise.

In addition, spatially relative terms such as "under," "below," "on," "above," and the like may be used herein to describe relationships between the elements illustrated in figures. The above terms are relative concepts, and described with respect to the direction indicated in figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that in the present disclosure, the terms "comprise," "include," "have," and the like specify a property, a numeral, an act, an operation, an element or a combination thereof, but do not exclude other properties, symbols, acts, operations, elements or combinations thereof.

Embodiments of the present disclosure herein relate to a protective film, and for example, to a protective film having reduced defects and an electronic device including the same, and a method for attaching the protective film. Hereinafter, exemplary embodiments of the present disclosure will be described in more detail with reference to the accompanying drawings.

FIG. 1 is a perspective view of an electronic device according to an embodiment of the present disclosure.

Referring to FIG. 1, an electronic device ED may display an image IMG through a display surface DD-IS. As a non-limiting example of the image IMG, a watch window image, a search window image, and icon images are displayed. The display surface DD-IS is parallel (e.g., substantially parallel) to a surface defined by a first direction DR1 and a second direction DR2. The direction of the normal line of the display surface DD-IS, e.g., the thickness direction of the electronic device ED, is indicated by a third direction DR3. The front surface (or upper surface) and the rear surface (or lower surface) of each of the members described hereinafter may be distinguished by the third direction DR3.

The display surface DD-IS may include: a display region DD-DA in which an image IMG is displayed; and a non-display region DD-NDA adjacent to the display region DD-DA. The non-display region DD-NDA is a region in which no image is displayed. For example, the non-display DD-NDA may be configured not to display an image. The display region DD-DA may have a rectangular shape. The non-display region DD-NDA may surround the display region DD-DA. However, embodiments of the present disclosure are not limited thereto, and the shape of the display region DD-DA and the shape of the non-display region DD-NDA may be relatively designed. In addition, in an embodiment of the present disclosure, the non-display region DD-NDA may be omitted.

In FIG. 1, a portable electronic device is illustrated as an example of an electronic device ED. However, embodiments of the present disclosure are not limited thereto, and the electronic device ED may be used for large-sized electronic devices such as, for example, televisions and monitors, and small and medium-sized electronic devices such as mobile phones, tablets, car navigation units, game machines, and smart watches.

FIGS. 2A-2F each exemplarily illustrate a state in which the electronic device illustrated in FIG. 1 is folded.

Figure 2A:
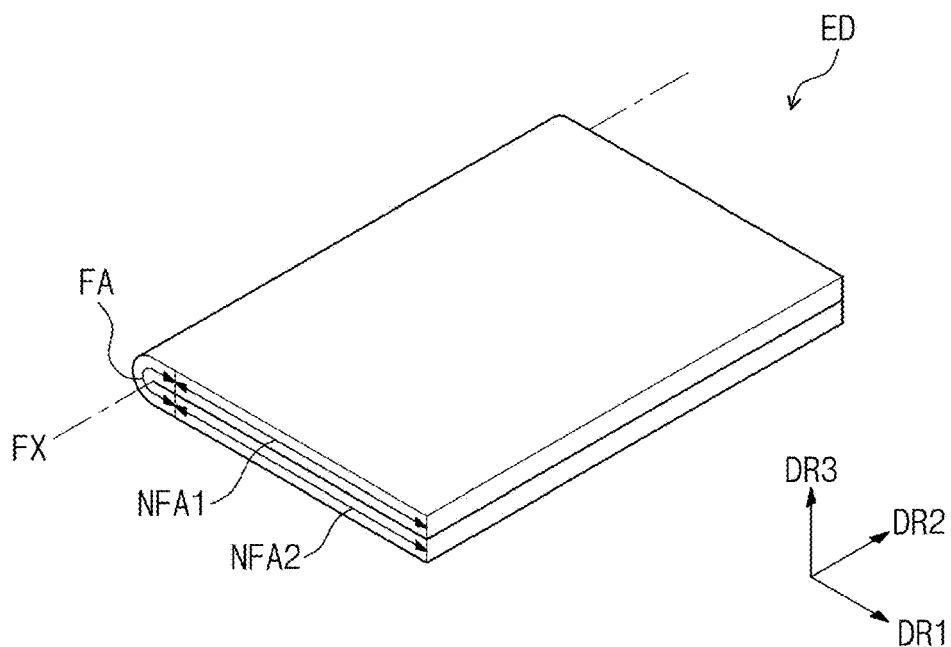
FIGS. 2A-2F each exemplarily illustrate states in which the electronic device illustrated in FIG. 1 is folded.

Referring to FIG. 2A, an electronic device ED may include a plurality of regions defined according to operation types (or operation modes). The electronic device ED may include a first region NFA1, a second region NFA2, and a third region FA between the first region NFA1 and the second region NFA2. The third region FA is a region folded on the basis of a folding axis FX and a region which substantially forms a curvature. Hereinafter the first region NFA1, the second region NFA2, and the third region FA may be referred to as a first non-folding region NFA1, a second non-folding region NFA2, and a folding region FA, respectively.

The electronic device ED according to an embodiment of the present disclosure may be inner-folded so that the display surface DD-IS of the first non-folding region NFA1 and the display surface DD-IS of the second non-folding region NFA2 face each other.

Figure 2B:
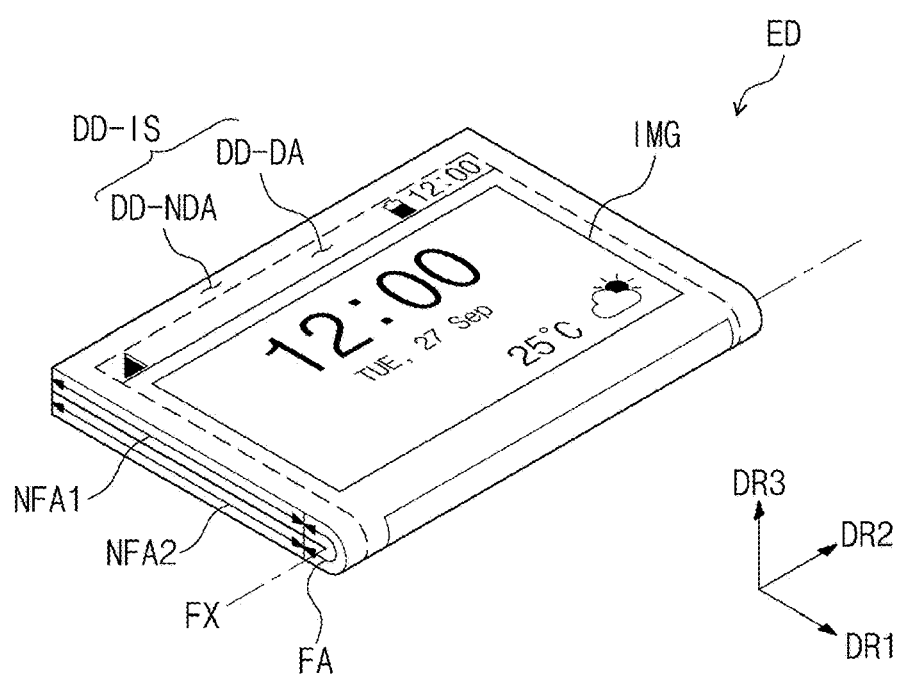

Referring to FIG. 2B, an electronic device ED may also be outer-folded so that the display surface DD-IS is exposed to the outside. For example, the electronic device ED may be outer-folded so that the display surface DD-IS of the first non-folding region NFA1 and the display surface DD-IS of the second non-folding region NFA2 face away from each other. The folding axis FX may extend in the second direction DR2 and the folding axis FX may be the short-axis direction of the electronic device ED.

Figure 2C:
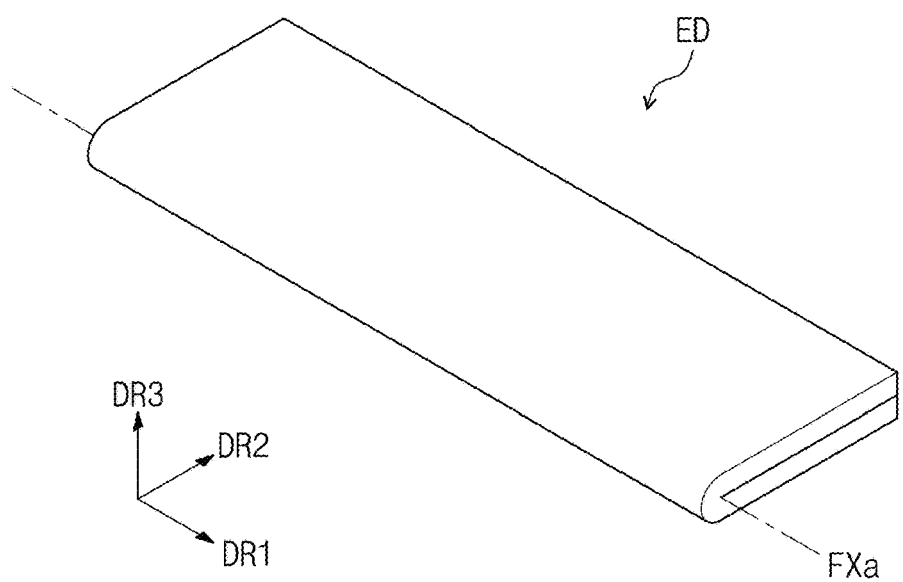

Referring to FIG. 2C, an electronic device ED according to an embodiment of the present disclosure may be inner-folded or outer-folded with respect to a folding axis FXa. The folding axis FXa may extend in the first direction DR1 and the folding axis FXa may be the long-axis direction of the electronic device ED.

Figure 2D:
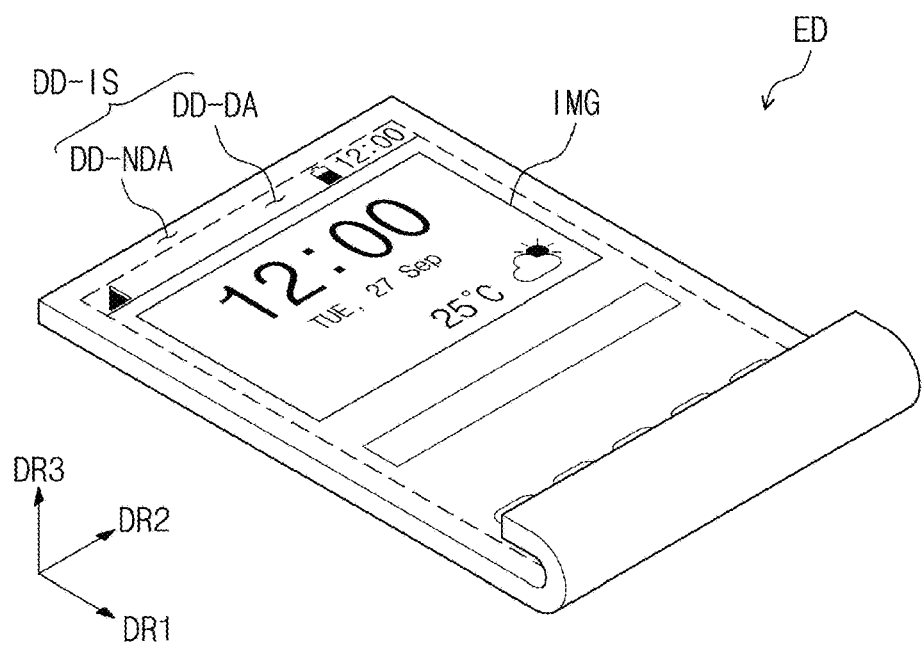
Figure 2E:
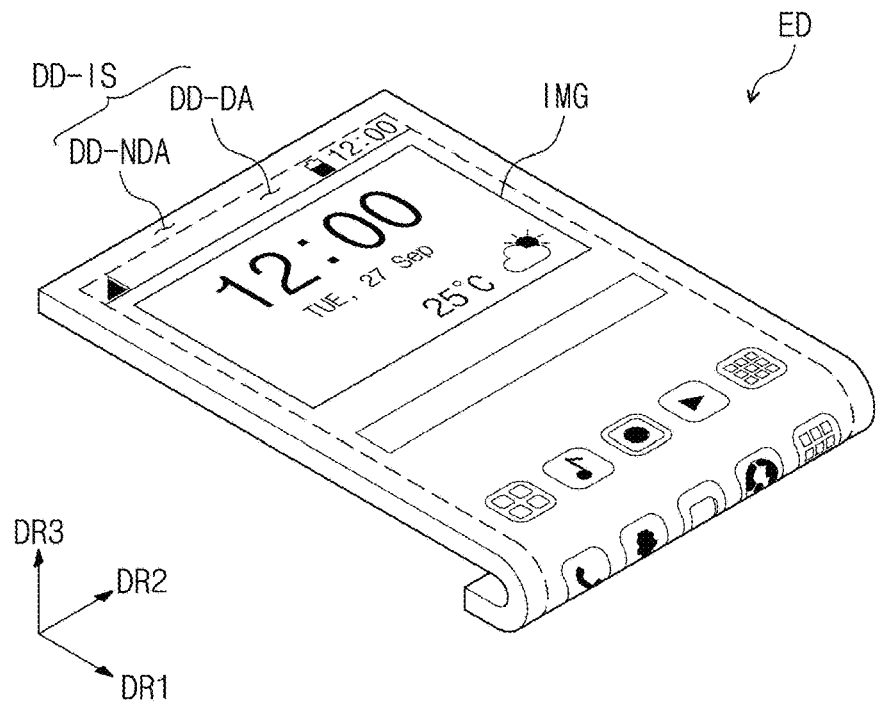
Figure 2F:
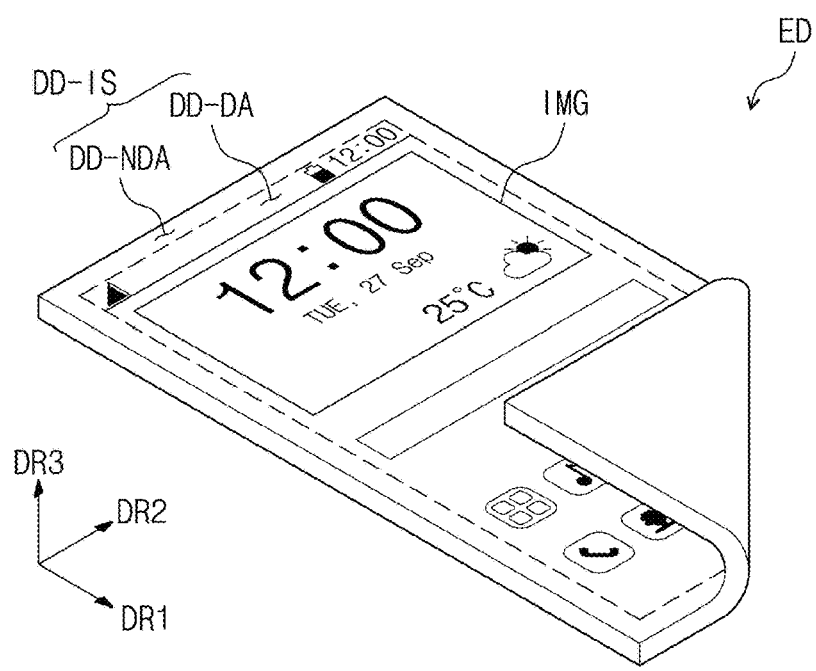

Referring to FIG. 2D, an electronic device ED according to an embodiment of the present disclosure may be inner-folded from one end portion. Referring to FIG. 2E, an electronic device ED according to an embodiment of the present disclosure may be outer-folded from one end portion. Referring to FIG. 2F, an electronic device ED according to an embodiment of the present disclosure may be diagonally folded. FIGS. 2A-2F exemplarily illustrate folding methods, and embodiments of the present disclosure are not limited thereto.

Figure 3A:
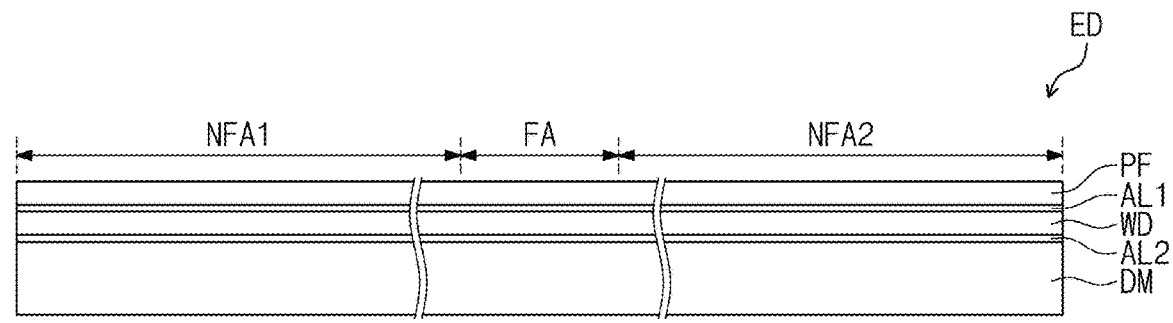
FIG. 3A is a cross-sectional view of an electronic device in a first state according to an embodiment of the present disclosure.
Figure 3B:
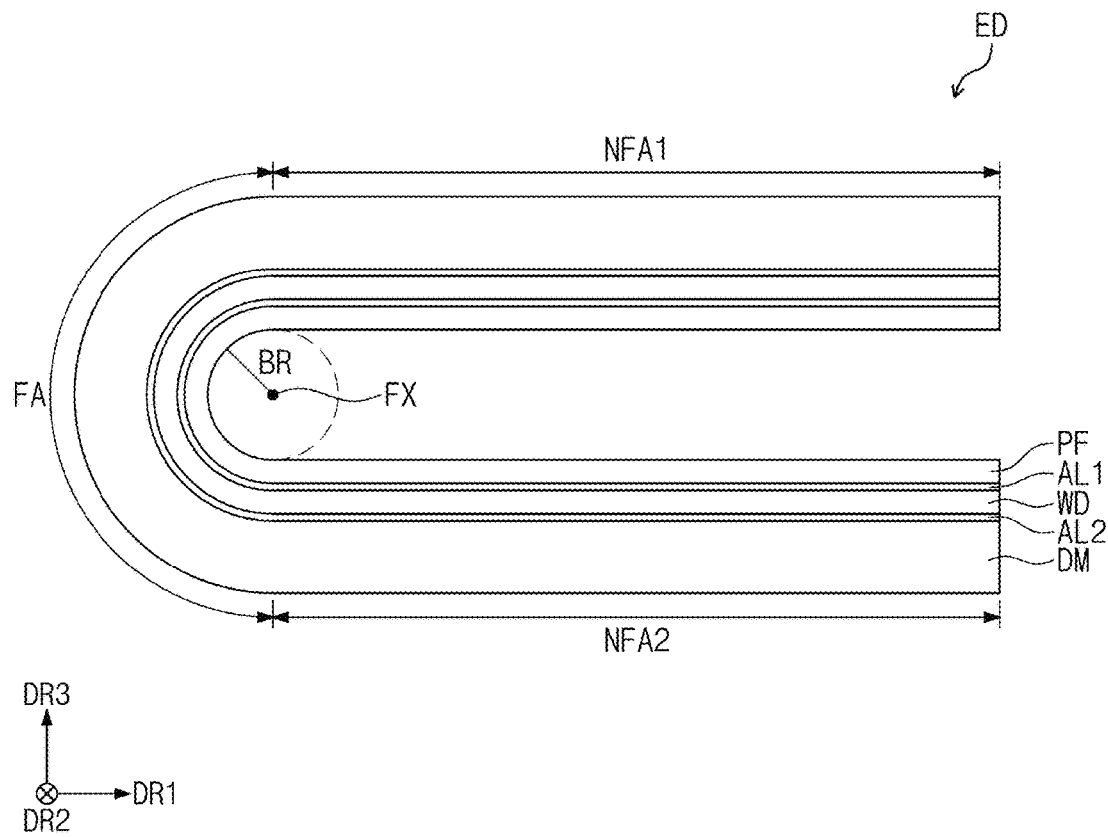
FIG. 3B is a cross-sectional view of an electronic device in a second state according to an embodiment of the present disclosure.

FIG. 3A is a cross-sectional view of an electronic device in a first state according to an embodiment of the present disclosure. FIG. 3B is a cross-sectional view of an electronic device in a second state according to an embodiment of the present disclosure.

Referring to FIGS. 3A and 3B, an electronic device ED may include a display module DM, a window WD, and a protective film PF. The electronic device ED may be a flexible electronic device, and thus, the display module DM, the window WD, and the protective film PF may each have a flexible property.

In an embodiment of the present disclosure, the shape of the electronic device ED may be repeatedly changed from a flat first state into a folded second state and/or from the second state into the first state. The folding region FA may be defined at a set or specific region, and the area of the folding region FA may be determined according to a folding radius BR. In an embodiment of the present disclosure, the position of the folding region FA may be changed corresponding to a form in which a user operates the electronic device ED. For example, when the user rolls the entirety (e.g., substantially the entirety) of the electronic device ED, the folding region FA may be the entirety (e.g., substantially the entirety) of the electronic device ED.

A first adhesive layer AL1 is between the protective film PF and the window WD, and a second adhesive layer AL2 may be between the window WD and the display module DM. Each of the first adhesive layer AL1 and the second adhesive layer AL2 may be an optically clear adhesive layer, an optically clear resin, and/or a pressure sensitive adhesive layer. However, this is merely illustrated as an example, and in another embodiment of the present disclosure, at least a portion of the first adhesive layer AL1 and the second adhesive layer AL2 may also be omitted.

Figure 4:
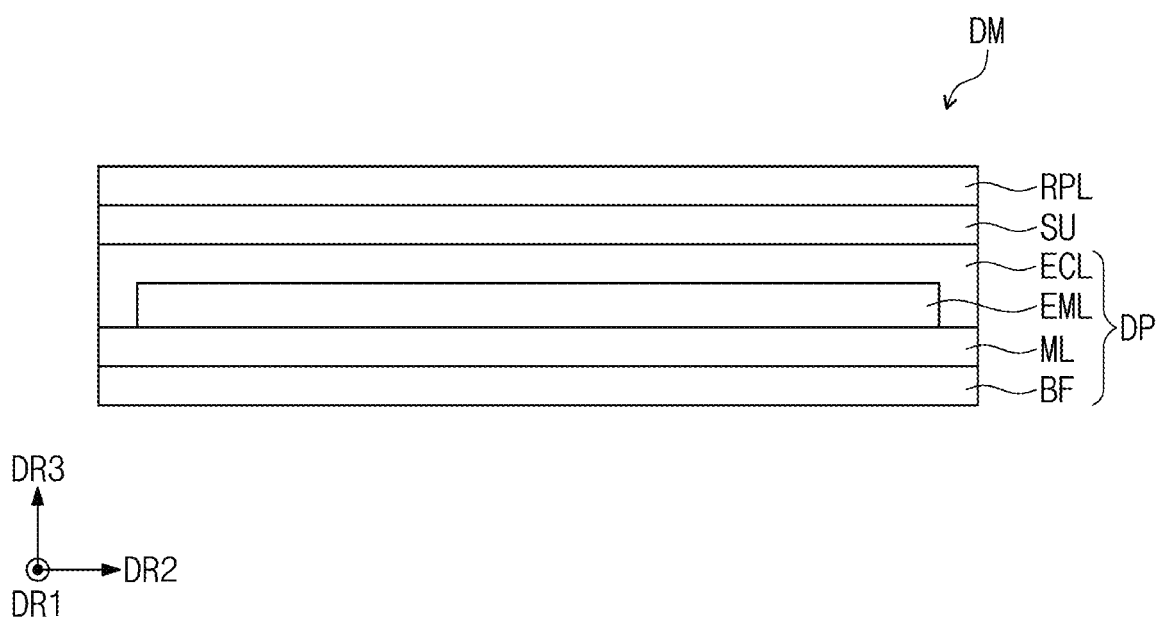
FIG. 4 is a cross-sectional view of a display module according to an embodiment of the present disclosure.

FIG. 4 is a cross-sectional view of a display module according to an embodiment of the present disclosure.

Referring to FIG. 4, the display module DM may include a display panel DP, a sensing unit SU, and a reflection prevention layer RPL. The sensing unit SU may be on the display panel DP, and the reflection prevention layer RPL may be on the sensing unit SU. However, the laminating order of the display module DM is not limited to the above example. For example, the sensing unit SU may be under the display panel DP, and may also be included as a configuration inside the display panel DP.

In an embodiment of the present disclosure, at least a portion of the sensing unit SU or the reflection prevention layer RPL may be omitted, and, for example, the display module DM may also include only the display panel DP. In an embodiment of the present disclosure, the reflection prevention layer RPL may also be between the sensing unit SU and the display panel DP.

The display panel DP may include a base layer BF, a circuit layer ML, a light-emitting element layer EML, and a thin film encapsulation layer ECL. In this specification, an organic light-emitting display panel is exemplarily described as an example of the display panel DP, but embodiments of the present disclosure are not particularly limited thereto.

The base layer BF may have a laminated structure including a silicon substrate, a plastic substrate, a glass substrate, an insulating film, and/or a plurality of insulating layers.

The circuit layer ML may be on the base layer BF. The circuit layer ML may include a plurality of insulating layers, a plurality of conductive layers, and a semiconductor layer. The light-emitting element layer EML may be on the circuit layer ML.

The light-emitting element layer EML includes display elements such as, for example, organic light-emitting diodes. However, embodiments of the present disclosure are not particularly limited thereto, and the light-emitting element layer EML may include inorganic light-emitting diodes and/or organic-inorganic hybrid light-emitting diodes according to the type or kind of the display panel DP.

The thin film encapsulation layer ECL encapsulates the light-emitting element layer EML. The thin film encapsulation layer ECL includes a plurality of inorganic layers and at least one organic layer interposed therebetween. The inorganic layers protect the light-emitting element layer EML from moisture and/or oxygen, and the organic layer protects the light-emitting element layer EML from foreign substances such as, for example, dust particles.

The sensing unit SU may include a circuit which detects a touch. The touch sensing method of the sensing unit SU may include a resistive film method, an optical method, an electrostatic capacitance method, an ultrasonic method, and/or the like, but embodiments of the present disclosure are not limited thereto. Among these, the electrostatic capacitance-type sensing unit SU may detect whether a touch occurs by using electrostatic capacitance when a touch generation object (e.g., a finger and/or stylus) contacts the screen of the electronic device ED (see FIG. 1). The electrostatic capacitance method may be divided into a mutual electrostatic capacitance method and a magnetic electrostatic capacitance method.

The sensing unit SU may be directly on the display panel DP. The term "directly on" means that attachment by using a separate adhesive member is excluded, and means formation by a continuous process. For example the sensing unit SU and the display panel DP may be in direct physical contact without any intervening layers therebetween. However, embodiments of the present disclosure are not limited thereto, and the display panel DP and the sensing unit SU may be coupled to each other by an adhesive member.

The reflection prevention layer RPL may be on the sensing unit SU. The reflection prevention layer RPL may reduce the reflectivity of external light incident from the outside. The reflection prevention layer RPL may include, for example, a polarizer.

Figure 5A:
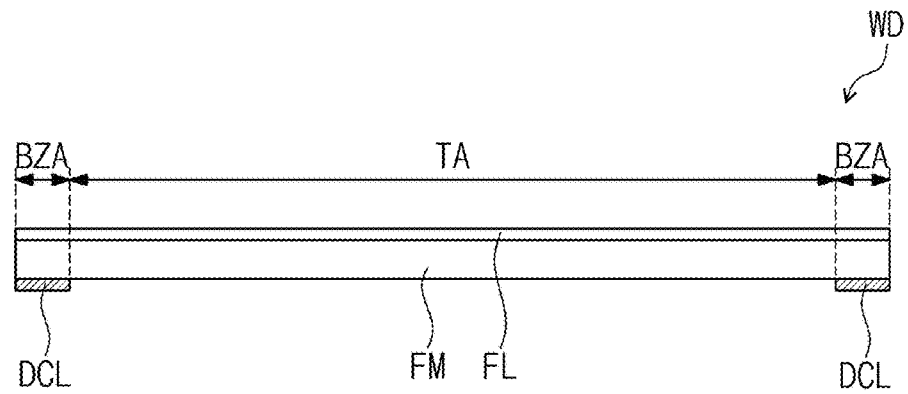
FIG. 5A is a cross-sectional view of a window according to an embodiment of the present disclosure.
Figure 5A:
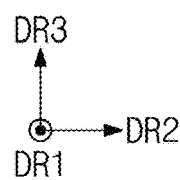

FIG. 5A is a cross-sectional view of a window according to an embodiment of the present disclosure.

Referring to FIG. 5A, a window WD may include a window film FM, a functional layer FL, and a pattern layer DCL.

The window film FM may include at least any one selected from polyimide (PI), polyamide imide (PAI), polyether ether ketone (PEEK), polyether imide (PEI), and glass. However, these are merely examples, and materials constituting the window film FM are not limited thereto.

The functional layer FL may be on the window film FM. For example, the functional layer FL may include at least any one selected from a fingerprint prevention layer, a reflection prevention layer, and a hard coating layer.

The window WD may be divided into a transmissive region TA and a bezel region BZA. The bezel region BZA may at least partially surround the transmissive region TA. Accordingly, the shape of the transmissive region TA may substantially be defined by the bezel region BZA. The bezel region BZA may correspond to the non-display region DD-NDA illustrated in FIG. 1. Accordingly, the transmissive region TA may have a rectangular (e.g., a substantially rectangular) shape. However, this is exemplarily illustrated, and the bezel region BZA may be adjacent to only one side of the transmissive region TA and may also be omitted.

The bezel region BZA may have a set or predetermined color. The pattern layer DCL may be under the window film FM and may define the bezel region BZA. For example, the pattern layer DCL may have a set or predetermined color, for example, black, blue, red, green, pink, gold, silver, and/or bronze. In an embodiment of the present disclosure, the pattern layer DCL may also be omitted.

Figure 5B:
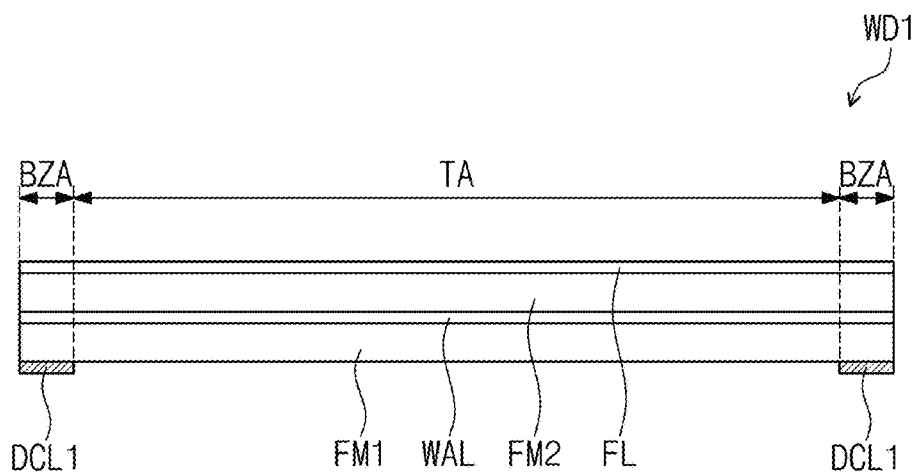
FIG. 5B is a cross-sectional view of a window according to an embodiment of the present disclosure.
Figure 5B:
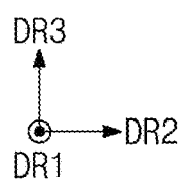

FIG. 5B is a cross-sectional view of a window according to an embodiment of the present disclosure. In describing FIG. 5B, the same reference symbols refer to the configurations described with respect to FIG. 5A, and therefore, duplicative descriptions thereof will not be repeated here.

Referring to FIG. 5B, a window WD1 may include at least two films FM1 and FM2, an adhesive layer WAL which attaches the films FM1 and FM2, a functional layer FL, and a pattern layer DCL1.

Each of the first film FM1 and the second film FM2 may include at least any one selected from polyimide (PI), polyamide imide (PAI), polyether ether ketone (PEEK), and polyether imide (PEI). However, these are merely examples, and the materials constituting each of the first film FM and the second film FM2 are not limited thereto. In an embodiment of the present disclosure, the first film FM1 and the second film FM2 may include the same material as each other and/or may also include materials different from each other. For example, the first film FM1 and the second film FM2 may also include materials having a different modulus (for example, Young's modulus) from each other.

The adhesive layer WAL may be between the first film FM1 and the second film FM2. The adhesive layer WAL may include an optically clear adhesive layer, an optically clear resin, and/or a pressure sensitive adhesive layer.

The pattern layer DCL1 may be under the first window film FM1 and may define the bezel region BZA. However, embodiments of the present disclosure are not limited thereto. The pattern layer DCL1 may also be on the upper surface of the first film FM1 or on the lower surface of the second film FM2. In addition, in an embodiment, a plurality of the pattern layer DCL1 may be provided, and in this case, may also be provided on the upper surface of the first film FM1 and the lower surface of the first film FM1. In an embodiment of the present disclosure, the pattern layer DCL1 may also be omitted.

Figure 6:
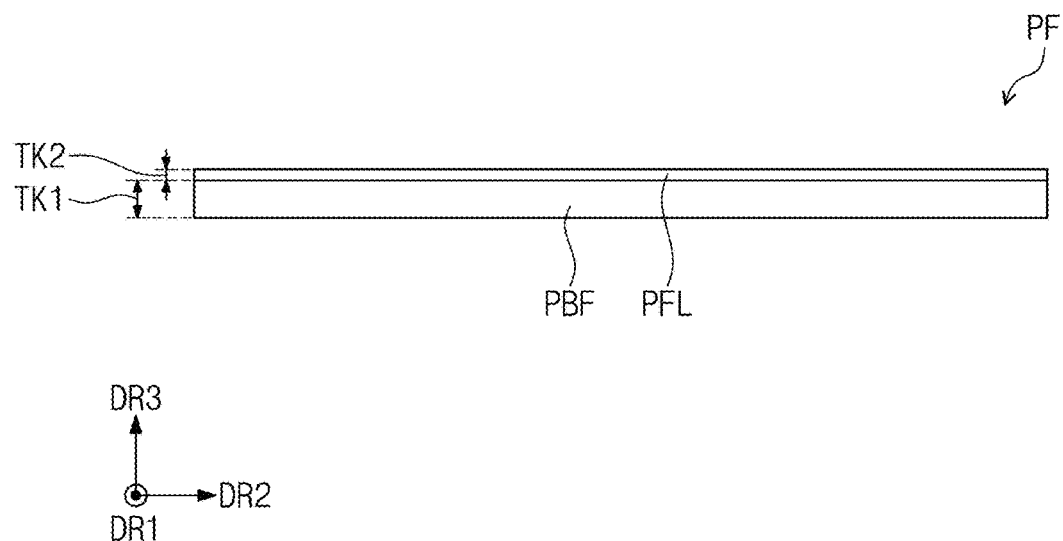
FIG. 6 is a cross-sectional view of a protective film according to an embodiment of the present disclosure.
Figure 7:
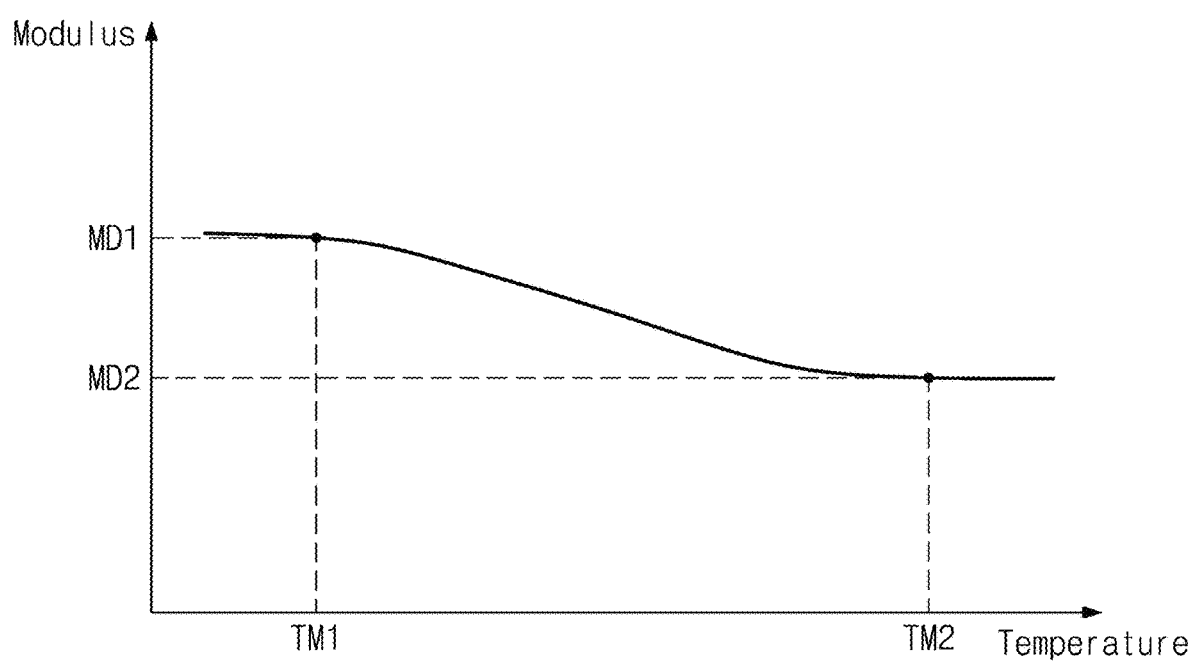
FIG. 7 is a modulus graph according to a temperature of a protective film according to an embodiment of the present disclosure.
Figure 8A:
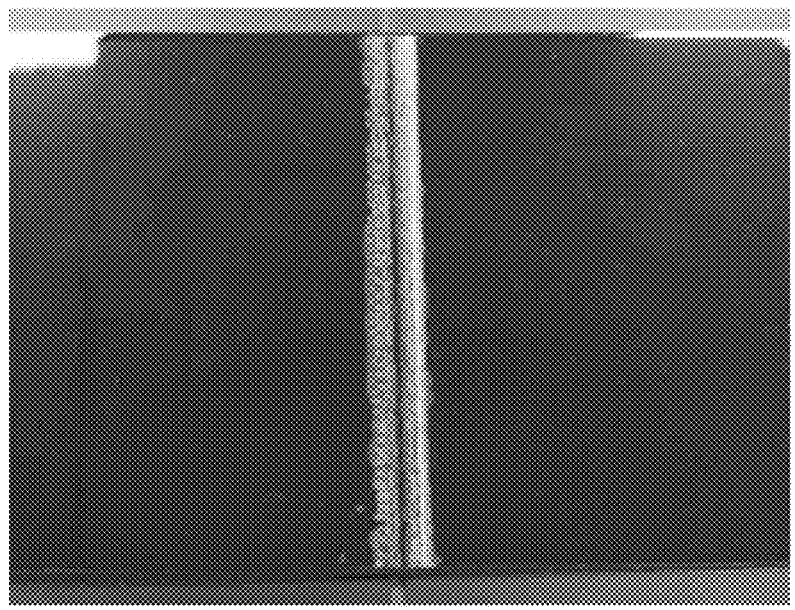
FIG. 8A is a photograph of a crack defect occurred in a low-temperature bendability test process.
Figure 8B:
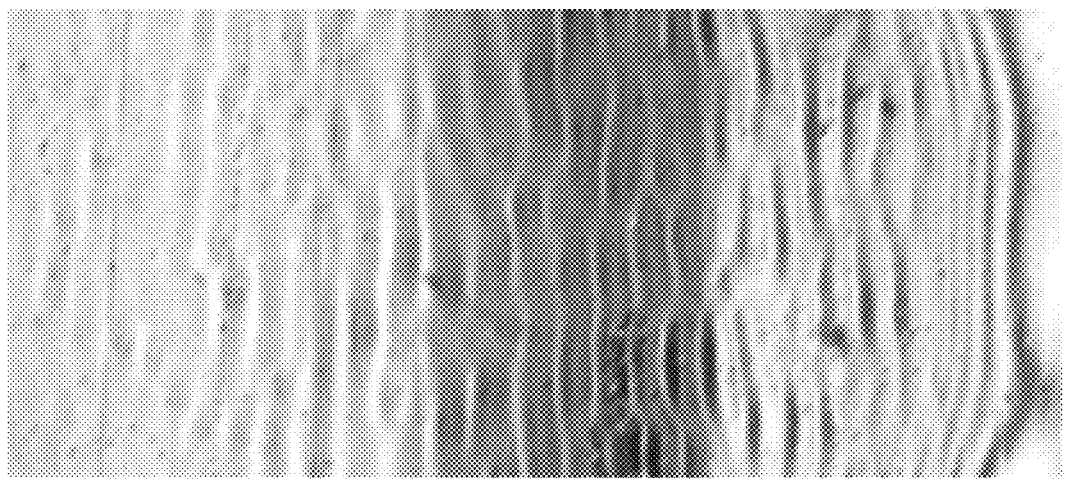
FIG. 8B is a photograph of a wrinkle defect occurred in a high-temperature bendability test process.

FIG. 6 is a cross-sectional view of a protective film according to an embodiment of the present disclosure. FIG. 7 is a modulus graph according to a temperature of a protective film according to an embodiment of the present disclosure. In some embodiments, the modulus may be the Young's modulus. FIG. 8A is a photograph of a crack defect occurred during a low-temperature bendability test process. FIG. 8B is a photograph of a wrinkle defect occurred during a high-temperature bendability test process.

Referring to FIGS. 6 and 7, a protective film PF may include a protective base film PBF and a functional layer PFL.

The protective base film PBF may have a first modulus MD1 at a first temperature TM1, and a second modulus MD2 at a second temperature TM2. The second temperature TM2 may be a higher temperature than the first temperature TM1, and the first modulus MD1 may be higher than the second modulus MD2.

The difference between the first temperature TM1 and the second temperature TM2 may be about 80 degrees Celsius (° C.), and the difference between the first modulus MD1 and the second modulus MD2 may be no greater than about 986 MPa. For example, the first temperature TM1 may be about minus 20° C., and the second temperature TM2 may be about 60° C. The first modulus MD1 may be no greater than about 1000 MPa, and the second modulus MD2 may be at least about 15 MPa. For example, the first modulus MD1 may be about 10 MPa or more to about 1,000 MPa or less, and the second modulus MD2 may be about 15 MPa or more to about 5 GPa or less.

When the first modulus MD1 of the protective base film PBF is greater than about 1,000 MPa, the protective base film PBF may be in a state of being too hard and easily broken. For example, the flexibility of the protective base film PBF may be degraded under a low-temperature environment, and when the protective base film PBF is bent, a crack may form in the protective base film PBF.

In addition, when the second modulus MD2 of the protective film PBF is lower than about 15 MPa, the protective base film PBF may be in too soft of a state. In this case, a slight wrinkle may form in the protective base film PBF due to a difference in the modulus between the protective base film PBF and the functional layer PFL.

The protective base film PBF may be selected from films having a modulus of no greater than about 1,000 MPa at about minus 20° C., and having a modulus of at least about 15 MPa at about 60° C. For example, the protective base film PBF may include a polymer film and/or a reinforced glass film which satisfies the above modulus range for each temperature. For example, the polymer film may include any one selected from films based on polyethylene, polypropylene, polystyrene, polyvinyl alcohol, polyvinylidene chloride, polymethylpentene, polymethyl methacrylate, polyurethane, cellulose, nylon, polycarbonate, polyester, polyacrylonitrile, polyacetal, or fluorine, and/or a nylon film. For example, the polymer film may include a polyethylene terephthalate (PET) film, a thermoplastic polyurethane (TPU) film, and/or a polycarbonate (PC) film. Aside from the polymer films listed above, the polymer film may include a copolymer having a modulus of no greater than about 1,000 MPa at about minus 20° C., and having a modulus of at least about 15 MPa at about 60° C. For example, the polymer film may include a copolymer composed of silicone polymer.

Hereinafter, Table 1 shows the results of a shock resistance test, a low-temperature bendability test, and a high-temperature bendability test for each of test targets.

TABLE 1

|  | Test target | Modulus (MPa) | | Pen Drop (bright spot/dark spot, cm) | Low temperature bendability | High temperature bendability |
| --- | --- | --- | --- | --- | --- | --- |
|  |  | Low temperature (−20° C.) | High temperature (60° C.) |  |  |  |
|  | Without application of protective base film | — | — | 1 | OK | OK |
| Comparative example | Protective base film A | 1880 | 48 | 8 | NG | OK |
|  | Protective base film B | 1560 | 33 | 7 | NG | OK |
|  | Protective base film C | 610 | 12 | 6 | OK | NG |
|  | Protective base film D | 750 | 9 | 6 | OK | NG |
| Example | Protective base film E | 334 | 67 | 7 | OK | OK |
|  | Protective base film F | 157 | 42 | 7 | OK | OK |
|  | Protective base film G | 728 | 58 | 9 | OK | OK |

In the shock resistance test, when a metal ball is dropped from a set or predetermined height, the height at which a dent defect occurs is recorded. In a low-temperature bendability test, whether a crack occurs through repeated folding under a low-temperature environment is evaluated. Additionally, in a high-temperature test, whether a wrinkle occurs through repeated folding under a high-temperature environment is evaluated. The dent defect may occur in a display panel DP (see FIG. 4), and this may be viewed as a bright spot or a dark spot. An electronic device ED (see FIG. 1) to which a protective base film, e.g., a protective film PF, is not attached passed both the low-temperature bendability test and the high-temperature bendability test. However, in the stage of the shock resistance test, when the test was performed at a height of about 1 cm, a bright spot and/or a dark spot occurred.

In each of the electronic devices to which a protective base film A to a protective base film G were attached, a bright spot and/or dark spot occurred due to shock applied from the smallest height of about 6 cm to the largest height of about 9 cm in the shock resistance test stage. For example, the test height, at which the bright spot and/or the dark spot occurred, increased by 5 cm at a minimum, and increased as much as 8 cm, when the protective base film was attached. Accordingly, in case of an electronic device to which a protective base film is further applied, it could be found that the shock resistance performance was further improved.

The protective base film A has a first modulus of about 1,880 MPa at a low temperature, and a second modulus of about 48 MPa at a high temperature. For example, the first modulus of the protective base film A may not satisfy the range of no greater than 1,000 MPa, and the second modulus MD2 satisfies the modulus of at least about 15 MPa. In this case, the protective base film A passed the high-temperature bendability test, but in the low-temperature bendability test, when folding was performed 15 thousand times, a crack occurred and could not pass the low-temperature bendability test. The protective base film B also has, at a low temperature, a modulus of about 1,560 MPa which exceeds 1,000 MPa. Accordingly, when the protective base film B was folded 52 thousand times, a crack occurred and could not pass the low-temperature bendability test. FIG. 8A is a photograph which images a crack defect occurred in a low-temperature bendability test process.

The protective base film C and the protective base film D both have a low-temperature modulus of no greater than 1,000 MPa, but both have a high-temperature modulus of no greater than 15 MPa. Accordingly, the protective base film C and the protective base film D passed the low-temperature bendability test but could not pass the high-temperature bendability test. A wrinkle occurred in the protective base film C when the film C was folded about 5,000 times, and a wrinkle occurred in the protective base film D when the film D was folded about 12,000 times. FIG. 8B is a photograph showing images of a wrinkle defect that occurred during a high-temperature bendability test process.

However, the low-temperature moduli of the protective base film E, the protective base film F, and the protective base film G satisfy a range of no greater than about 1,000 MPa, and the high-temperature modulus thereof satisfy a range of at least about 15 MPa. Accordingly, the protective base film E, the protective base film F, and the protective base film G passed both the low-temperature bendability test and the high-temperature bendability test. Accordingly, the electronic device ED (see FIG. 1) to which a protective base film PBF having a low-temperature modulus satisfying a range of no greater than about 1,000 MPa and a high-temperature modulus satisfying a range of at least about 15 MPa is applied may have improved reliability. For example, even when repeated deformation of the electronic device ED occurs under a low-temperature environment or a high-temperature environment, a problem in which a crack occurs in the protective film PF, or a wrinkle occurs in the protective film PF may be reduced. In addition, because the protective film PF is attached on to the window WD (see FIG. 4), the shock resistance performance of the electronic device ED may be improved.

The functional layer PFL may be on the protective base film PBF. The functional layer PFL may include at least any one selected from a fingerprint prevention layer, a reflection prevention layer, and a hard coating layer.

The protective base film PBF may have a first thickness TK1, and the functional layer PFL may have a second thickness TK2. The second thickness TK2 may be no greater than about one tenth of the first thickness TK1. For example, the first thickness TK1 may be about 30 μm to 300 μm inclusive, and the second thickness TK2 may be no greater than about 5 μm. For example, the first thickness TK1 may be about 100 μm, and the second thickness TK2 may be about 3 μm.

Figure 9A:
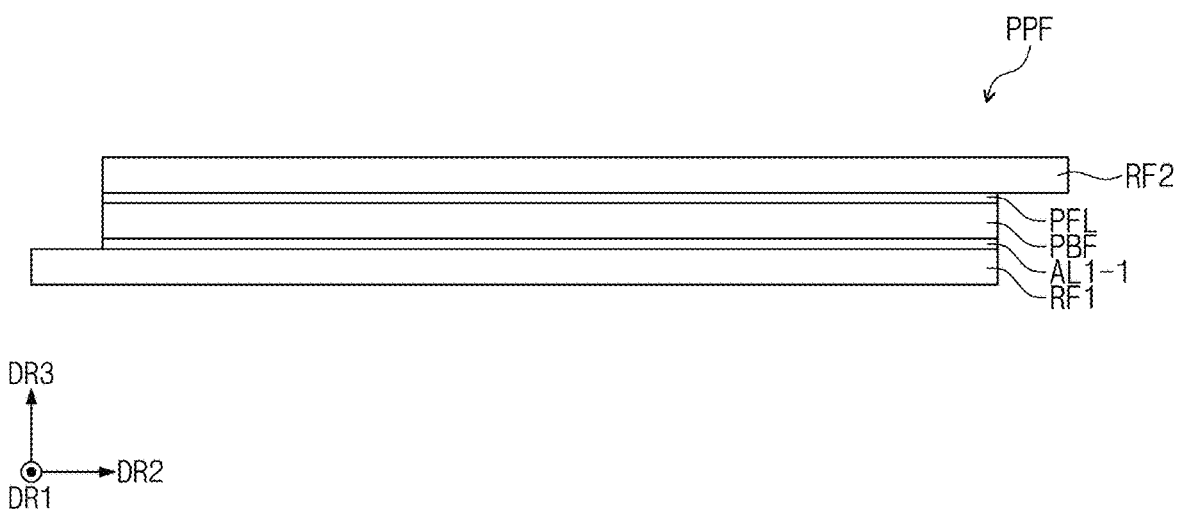
FIG. 9A is a cross-sectional view of a protective film according to an embodiment of the present disclosure.
Figure 9B:
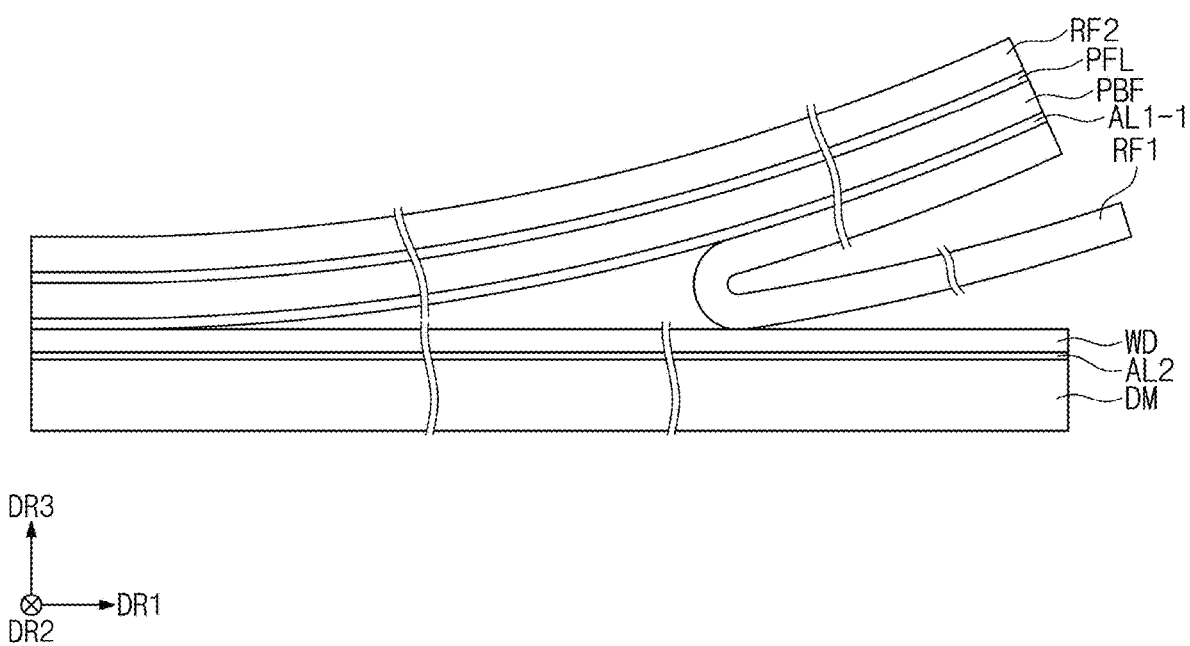
FIG. 9B is a cross-sectional view illustrating a state in which a protective film is attached to an electronic device according to an embodiment of the present disclosure.

FIG. 9A is a cross-sectional view of a protective film according to an embodiment of the present disclosure. FIG. 9B is a cross-sectional view illustrating a state in which a protective film is attached to an electronic device according to an embodiment of the present disclosure.

Referring to FIGS. 9A and 9B, a single protective film PPF may also be separately provided. The single protective film PPF may include a protective base film PBF, a functional layer PFL, a first adhesive layer AL1-1, a first release layer RF1, and a second release layer RF2.

The protective base film PBF may be selected from films having a modulus of no greater than about 1,000 MPa at about minus 20° C., and having a modulus of at least about 15 MPa at about 60° C. The functional layer PFL may be on the protective base film PBF. The functional layer PFL may include at least any one from a fingerprint prevention layer, a reflection prevention layer, a dazzling prevention layer, and a hard coating layer. The first adhesive layer AL1-1 may be under the protective base film PBF. The first adhesive layer AL1-1 may be a layer attached to a window WD.

The first release layer RF1 may be under the first adhesive layer AL1-1, and the second release layer RF2 may be on the functional layer PFL. In another embodiment of the present disclosure, the second release layer RF2 may also be omitted. The first release layer RF1 and the second release layer RF2 may include a portion protruding so as to be easily separated from the first adhesive layer AL1-1 and the functional layer PFL.

A user may directly attach the single protective film PPF to an electronic device ED-1. For example, the user may attach the single protective film PPF to the electronic device ED-1 having the window WD as the outermost surface thereof. The user may separate the first release layer RF1 from the first adhesive layer AL1-1, bring the first adhesive layer AL1-1 into close contact with the window WD, and attach the protective base film PBF to the window WD. The release layer RF2 may also be separated from the functional layer PFL.

FIGS. 10A-10E are cross-sectional views illustrating a method for attaching a protective film according to an embodiment of the present disclosure.

Figure 10A:
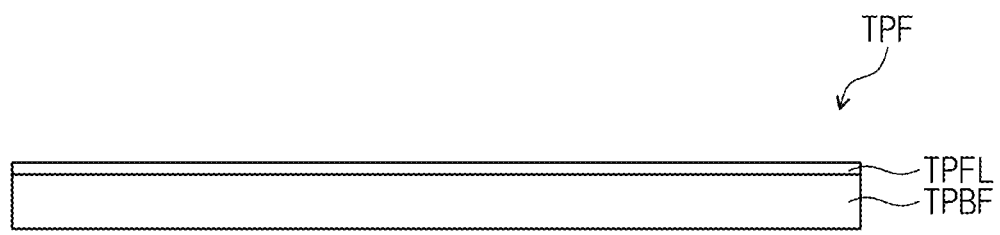
FIGS. 10A-10E are cross-sectional views illustrating a method for attaching a protective film according to an embodiment of the present disclosure.

Referring to FIG. 10A, a test protective film TPF is prepared. The test protective film TPF may include a protective base film TPBF and a functional layer TPFL.

Figure 10B:
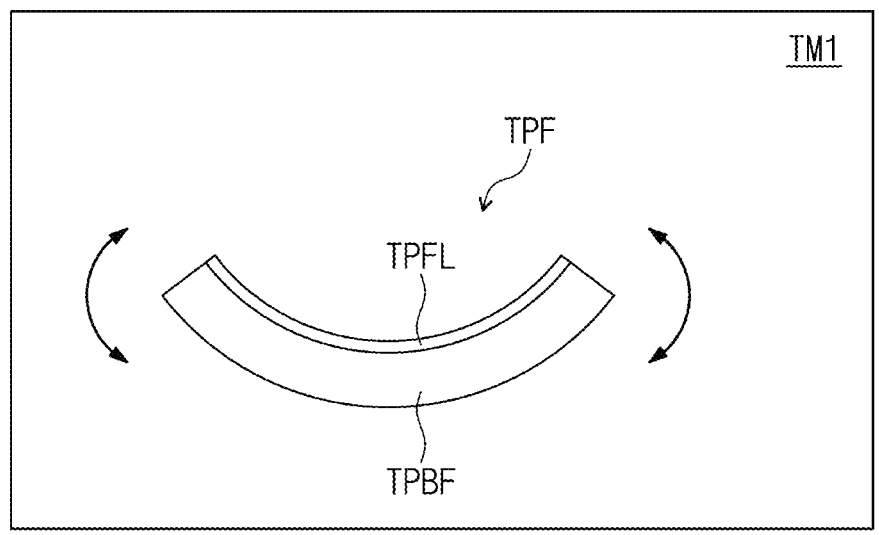
Figure 10C:
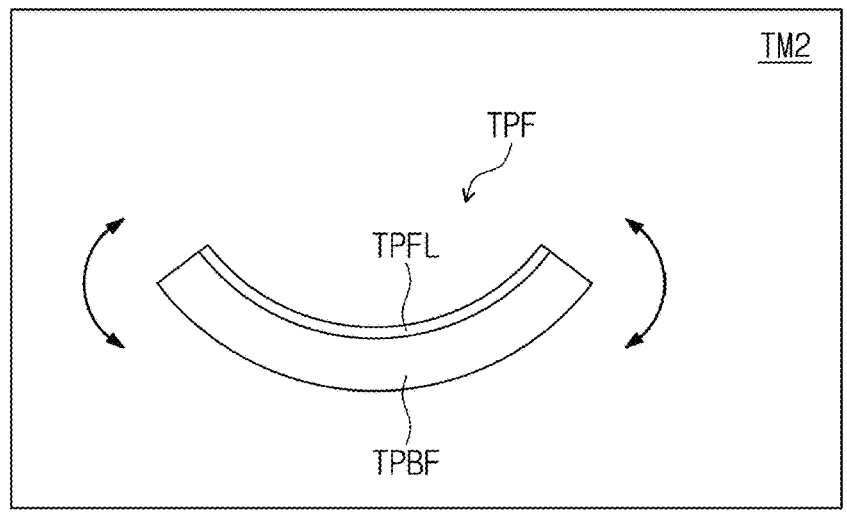

Referring to FIG. 10B, a first modulus of the test protective film TPF is measured at a first temperature TM1. The first temperature TM1 may be about minus 20° C. Referring to FIG. 10C, a second modulus of the test protective film TPF is measured at a second temperature TM2. The second temperature TM2 may be about 60° C. The first modulus and the second modulus may be measured by a dynamic mechanical analysis method. For example, a periodic stress such as folding or bending is applied to the test protective film TPF, and the moduli according to temperatures may be measured by the dynamic mechanical analysis method.

Figure 10D:
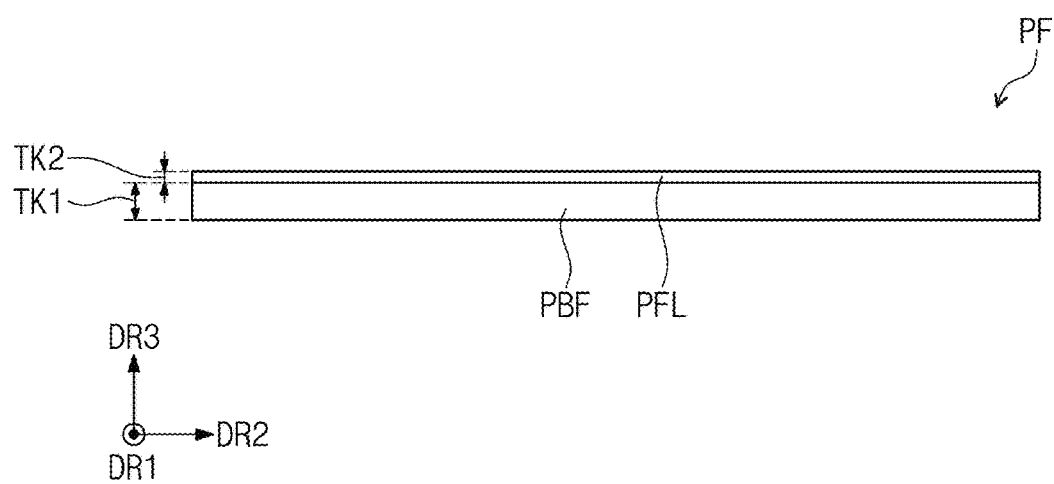

Referring to FIG. 10D, the first modulus and the second modulus are checked (e.g., measured or tested). For example, whether the first modulus is no greater than about 1,000 MPa, and whether the second modulus is at least about 15 MPa may be checked (e.g., measured or tested). When the first modulus and the second modulus satisfy the modulus condition, a protective film PF having the same (e.g., substantially the same) physical property as the test protective film TPF is prepared. For example, the protective film PF may have the same (e.g., substantially the same) modulus as the test protective film TPF.

Figure 10E:
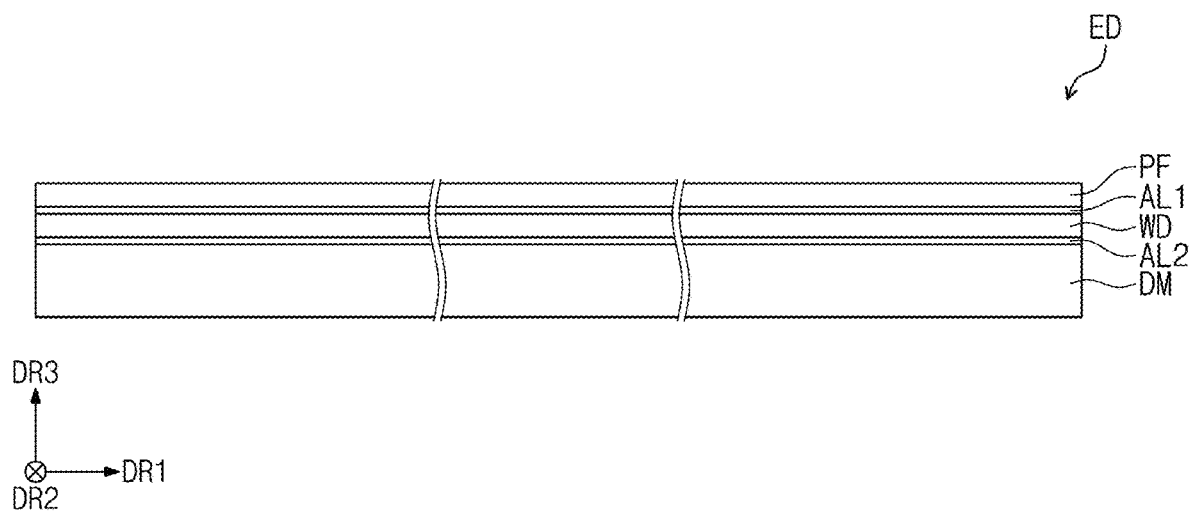

Referring to FIG. 10E, the protective film PF is attached to a target object. The target object may be a window WD. The protective film PF may be coupled to the window WD by the first adhesive layer AL1-1.

FIGS. 11A-11F are cross-sectional views illustrating a method for attaching a protective film according to an embodiment of the present disclosure.

Figure 11A:
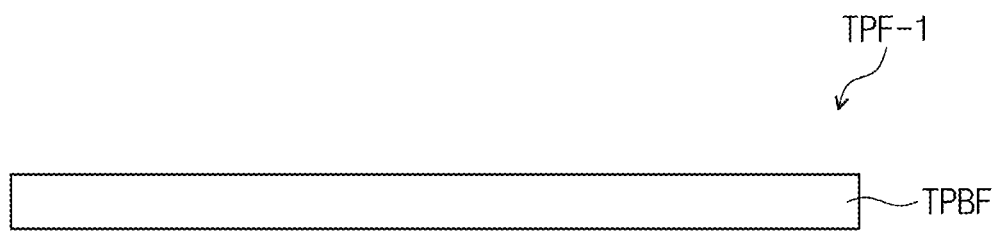
FIGS. 11A-11F are cross-sectional views illustrating a method for attaching a protective film according to an embodiment of the present disclosure.

Referring to FIG. 11A, a test protective film TPF-1 is prepared. The test protective film TPF-1 may include only a protective base film TPBF.

Figure 11B:
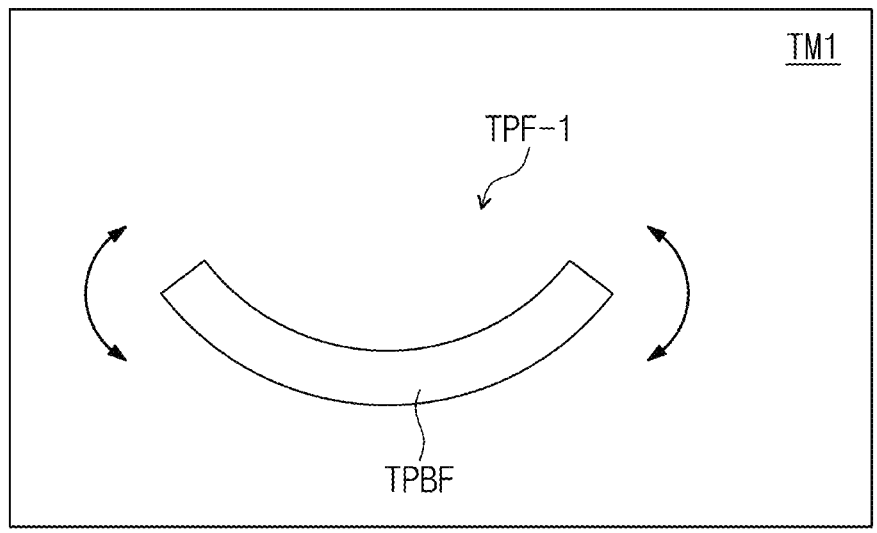
Figure 11C:
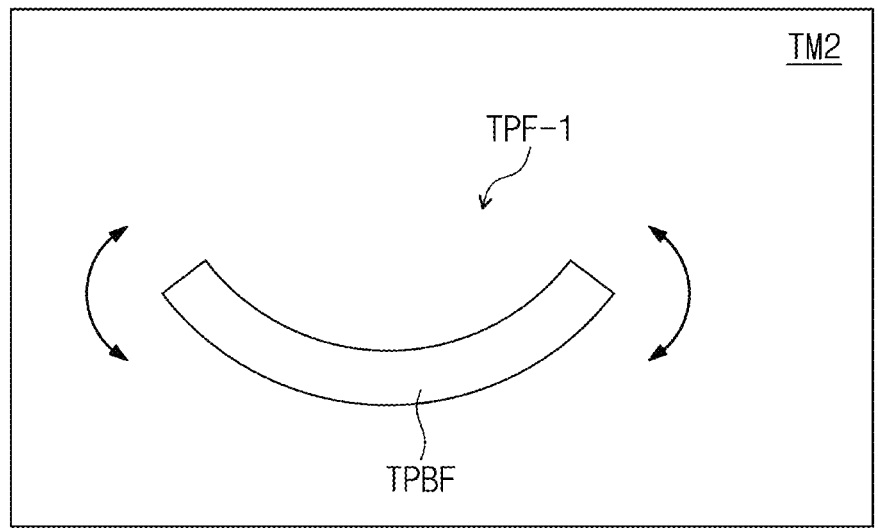

Referring to FIG. 11B, a first modulus of the test protective film TPF-1 is measured at a first temperature TM1. The first temperature TM1 may be about minus 20° C. Referring to FIG. 11C, a second modulus of the test protective film TPF-1 is measured at a second temperature TM2. The second temperature TM2 may be about 60° C.

Figure 11D:

Referring to FIG. 11D, the first modulus and the second modulus are checked (e.g., measured or tested). For example, whether the first modulus is no greater than about 1,000 MPa, and whether the second modulus is at least about 15 MPa may be checked (e.g., measured or tested). When the first modulus and the second modulus satisfy the modulus condition, a protective base film PBF-1 having the same (e.g., substantially the same) physical property as the test protective film TPF-1 is prepared. For example, the protective film PBF-1 may have the same (e.g., substantially the same) modulus as the test protective film TPF-1.

Figure 11E:
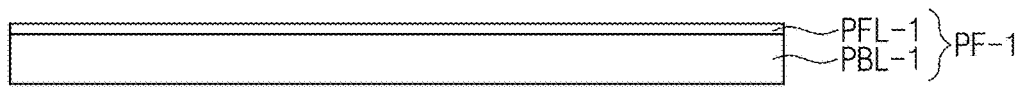

Referring to FIG. 11E, a functional layer PFL-1 is formed on the protective base film PBL-1 to form a protective film PF-1.

Figure 11F:
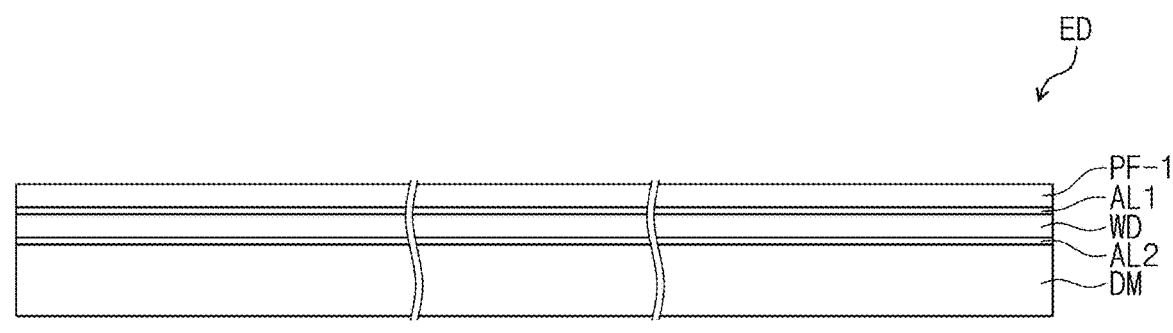
Figure 11F:
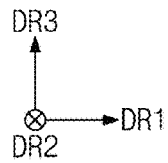

Referring to FIG. 11F, the protective film PF-1 is attached to a target object. The target object may be a window WD. The protective film PF-1 may be coupled to the window WD by a first adhesive layer AL1.

Figure 12A:
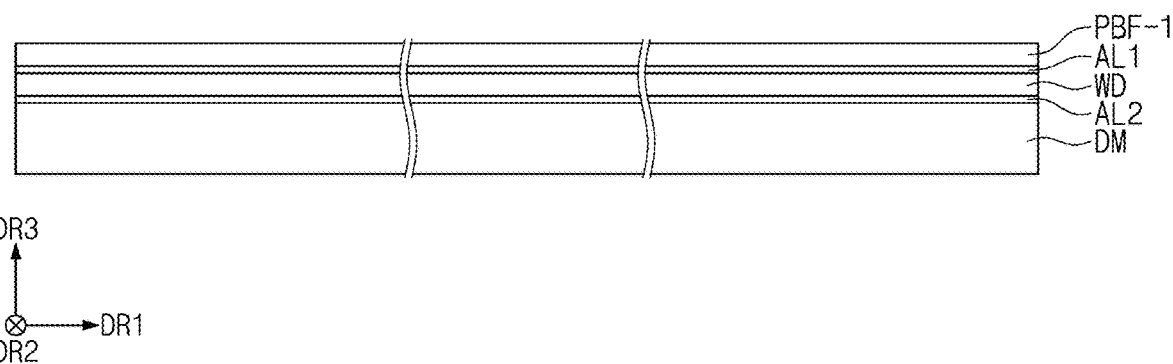
FIGS. 12A and 12B are cross-sectional views illustrating a method for attaching a protective film according to an embodiment of the present disclosure.
Figure 12B:
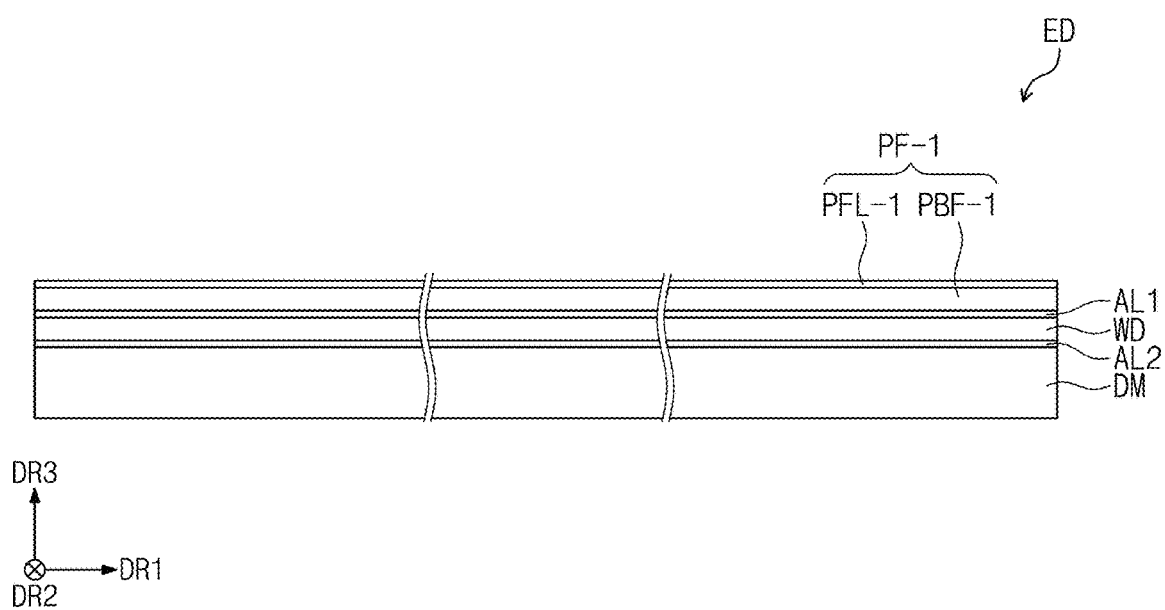

FIGS. 12A and 12B are cross-sectional views illustrating a method for attaching a protective film according to an embodiment of the present disclosure.

Referring to FIGS. 12A and 12B, a protective base film PBF-1 having the same (e.g., substantially the same) physical property as the test protective film TPF-1 (see FIG. 11A) is prepared. The protective base film PBF-1 is attached to a target object. The target object may be a window WD. The protective film PBF-1 may be coupled to the window WD by a first adhesive layer AL1. The window WD may be coupled to a display module DM by a second adhesive layer AL2.

After the protective base film PBF-1 is attached to the window WD, a functional layer PFL-1 may be formed on the protective base film PBF-1. As a result, a protective film PF-1 may be formed on the window WD.

Figure 13:
FIG. 13 is a cross-sectional view illustrating a method for attaching a protective film according to an embodiment of the present disclosure.
Figure 13:
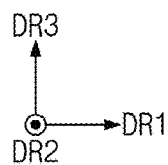

FIG. 13 is a cross-sectional view illustrating a method for attaching a protective film according to an embodiment of the present disclosure.

Referring to FIG. 13, before a window WD is coupled to a display module DM (see FIG. 3A), a protective film PF may be attached to the window WD by an adhesive layer AL1.

Figure 14:
FIG. 14 is a cross-sectional view illustrating a method for attaching a protective film according to an embodiment of the present disclosure.
Figure 14:
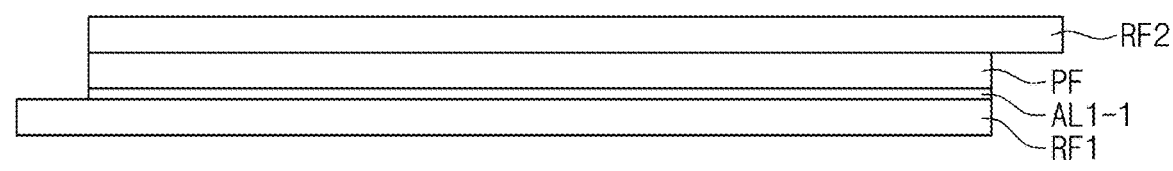
Figure 14:
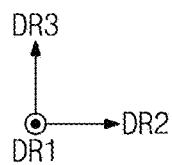

FIG. 14 is a cross-sectional view illustrating a method for attaching a protective film according to an embodiment of the present disclosure.

Referring to FIG. 14, a target object to which a protective film PF is attached may be a first release layer RF1, attached by way of an adhesive layer AL1-1. The first release film RF1 and a second release layer RF2 are attached to the protective film PF, so that a single protective film PPF may be formed.

According to an embodiment of the present disclosure, a protective film PF applied to a flexible electronic device ED (see FIG. 1) may include a film having a first modulus at a low temperature and a second modulus at a high temperature which satisfy a set or specific range. Accordingly, even when a user uses the electronic device ED under a low-temperature environment or a high-temperature environment, a phenomenon in which a crack occurs and a wrinkle occurs may be prevented or reduced, and product reliability may be improved.

According to embodiments of the present disclosure, an electronic device includes a protective film. Accordingly, the shock resistance of the electronic device may be improved. In addition, the protective film may satisfy set or specific modulus conditions under each of a low temperature and a high temperature. A probability that a crack occurs in the protective film under a low-temperature environment and a probability that a wrinkle occurs in the protective film under a high-temperature environment may decrease or be reduced. Consequently, the reliability of the electronic device may be improved.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

So far, example embodiments of the present disclosure have been described. However, it will be apparent to those skilled in the art that various modifications and variations can be made to the subject matter of the present disclosure. Thus, it is intended that the present disclosure covers modifications and variations of the subject matter of the present disclosure that are within the spirit and scope of the appended claims and their equivalents. Therefore, the scope of the present disclosure is defined not by the detailed description of the present disclosure but by the appended claims, and equivalents thereof.

What is claimed is:

1. An electronic device comprising:
   a flexible display module;
   a window on the flexible display module; and
   a protective base film on the window, and having a first modulus at a first temperature and a second modulus lower than the first modulus at a second temperature that is about 80° C. higher than the first temperature,
   wherein a difference between the first modulus and the second modulus is 985 MPa or less.

2. The electronic device of claim 1, wherein the first temperature is about minus 20° C., and the second temperature is about 60° C.

3. The electronic device of claim 1, wherein the first modulus is 1,000 MPa or less.

4. The electronic device of claim 1, wherein the second modulus is 15 MPa or more.

5. The electronic device of claim 1, further comprising a functional layer on the protective base film.

6. The electronic device of claim 5, wherein a thickness of the functional layer is no greater than about one tenth of a thickness of the protective base film.

7. The electronic device of claim 1, wherein a thickness of the protective base film is about 30 μm or more to about 300 μm or less.

8. The electronic device of claim 1, further comprising an adhesive layer between the window and the protective base film.

9. The electronic device of claim 1, wherein the flexible display module is a foldable display module.

10. The electronic device of claim 1, wherein the flexible display module comprises:
    a display panel;
    a sensing unit on the display panel; and
    a reflection prevention layer on the sensing unit.

* * * * *